(12) United States Patent
Kim

(10) Patent No.: US 10,088,515 B2
(45) Date of Patent: Oct. 2, 2018

(54) ELECTRONIC DEVICE AND METHOD FOR DETERMINING DEFECT IN AN ELECTRONIC DEVICE

(71) Applicant: Samsung Electronics Co., Ltd., Gyeonggi-do (KR)

(72) Inventor: Sung-Su Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 378 days.

(21) Appl. No.: 14/918,857

(22) Filed: Oct. 21, 2015

(65) Prior Publication Data

US 2016/0116509 A1   Apr. 28, 2016

(30) Foreign Application Priority Data

Oct. 22, 2014   (KR) .................. 10-2014-0143187

(51) Int. Cl.
*G01R 31/04*   (2006.01)

(52) U.S. Cl.
CPC .................. *G01R 31/045* (2013.01)

(58) Field of Classification Search
CPC .................................... G01R 31/045
See application file for complete search history.

(56) References Cited

U.S. PATENT DOCUMENTS

| 2008/0265838 A1* | 10/2008 | Garg | G06F 1/266 |
| | | | 320/115 |
| 2010/0293302 A1* | 11/2010 | Fujii | G06F 13/4081 |
| | | | 710/16 |
| 2010/0328087 A1* | 12/2010 | Kanno | H04M 11/062 |
| | | | 340/661 |
| 2013/0320777 A1* | 12/2013 | Nakanishi | H03K 17/94 |
| | | | 307/130 |

* cited by examiner

*Primary Examiner* — Scott Bauer
(74) *Attorney, Agent, or Firm* — Cha & Reiter, LLC

(57) ABSTRACT

According to an embodiment of the present disclosure, an electronic device may comprise an external device connector having at least one connection sensing pin to sense connection to at least one external device connector, a voltage sensor measuring a voltage at the at least one connection sensing pin and a controller determining that a defect occurs when the voltage measured by the voltage sensor meets a preset condition. Other various embodiments are also provided herein.

20 Claims, 7 Drawing Sheets

ELECTRONIC DEVICE AND METHOD FOR DETERMINING DEFECT IN AN ELECTRONIC DEVICE

CLAIM OF PRIORITY

This application claims the benefit under 35 U.S.C. § 119(a) of a Korean patent application filed in the Korean Intellectual Property Office on Oct. 22, 2014 and assigned Serial No. 10-2014-0143187, the entire disclosure of which is incorporated herein by reference.

TECHNICAL FIELD

Various embodiments of the present disclosure relate to electronic devices and methods for abnormalities in electronic devices.

BACKGROUND

Generally, an electronic device comprises a device performing a particular function according to an equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated and high-speed, high-volume wireless communication have become commonplace. Additionally, mobile communication terminals are recently being equipped with various functions in addition to phone calls.

For example, an electronic device comes with the integrated functionality, including an entertainment function, such as playing video games, a multimedia function, such as replaying music/videos, a communication and security function for mobile banking, and a scheduling or e-wallet function.

An electronic device may also have a connector that provides connection with a diversity of external electronic devices.

The connector of an electronic device connected with an external electronic device, if subject to an electric current while wet or moist, may leave a migration, deposit, or corrosion that is a cause of malfunction or damage to the electronic device.

The above information is presented as background information only to assist with an understanding of the present disclosure. No determination has been made, and no assertion is made, as to whether any of the above might be applicable as prior art with regard to the present disclosure.

SUMMARY

According to embodiments of the present disclosure, there may be provided an electronic device and method for determining a defect in an electronic device that may determine whether there is a defect in the connector of the electronic device by measuring a voltage at, at least, one pin of the connector.

To achieve the foregoing and other objects, according to an embodiment of the present disclosure, an electronic device may comprise an external device connector having at least one connection sensing pin to sense connection to at least one external device connector, a voltage sensor measuring a voltage at the at least one connection sensing pin and a controller determining that a defect exists when the voltage measured by the voltage sensor meets a preset condition.

According to an embodiment of the present disclosure, a method for determining a defect in an electronic device may comprise comparing a preset voltage with a voltage measured at, at least, one connection sensing pin provided in an external device connector to sense connection to at least one external device connector and determining that a defect exists when a result of the determination meets a preset condition.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

Throughout the drawings, like reference numerals will be understood to refer to like parts, components, and structures.

DETAILED DESCRIPTION

Figure 1:
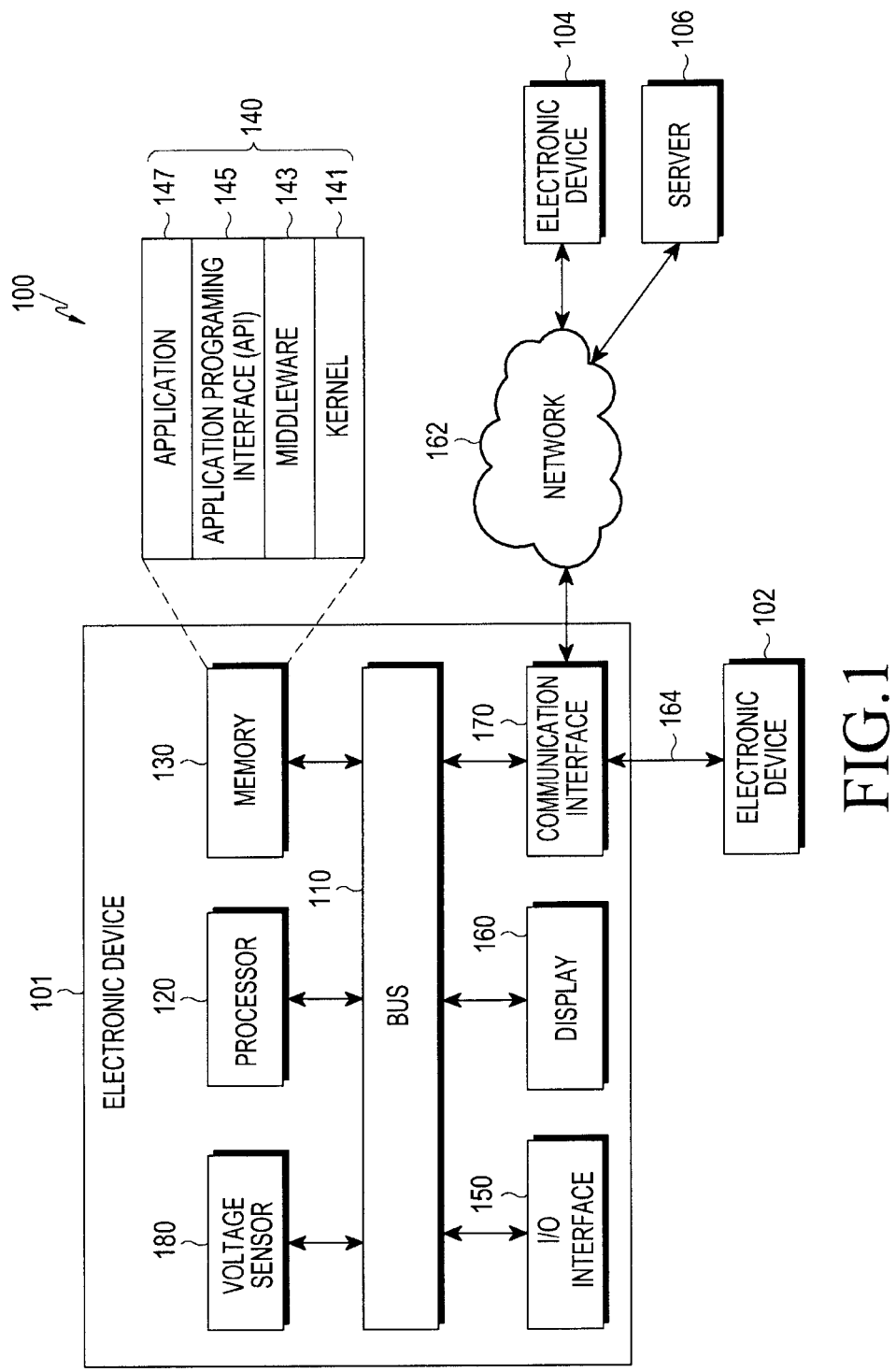
FIG. 1 is a view illustrating a network configuration according to an embodiment of the present disclosure.

Hereinafter, embodiments of the present disclosure are described with reference to the accompanying drawings. However, it should be appreciated that the present disclosure is not limited to the embodiments, and all changes and/or equivalents or replacements thereto also belong to the scope of the present disclosure. The same or similar reference denotations may be used to refer to the same or similar elements throughout the specification and the drawings.

As used herein, the terms "have," "may have," "include," or "may include" a feature (e.g., a number, function, operation, or a component such as a part) indicate the existence of the feature and do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including A but not B, (2) including B but not A, or (3) including A and B.

As used herein, the terms "first" and "second" may modify various components regardless of importance and do not limit the components. These terms are only used to distinguish one component from another. For example, a first user device and a second user device may indicate different user devices from each other regardless of the order or importance of the devices. For example, a first component may be denoted a second component, and vice versa without departing from the scope of the present disclosure.

It will be understood that when an element (e.g., a first element) is referred to as being (operatively or communicatively) "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," or "made to," depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a CPU or application processor) that may perform the operations A, B, and C by executing one or more software programs stored in a memory device or a dedicated processor (e.g., an embedded processor) for performing the operations A, B, and C.

As used herein, the term "connector" may mean a part connected to make an electrical connection between a first electronic device and a second electronic device and is not limited to a particular connecting method or form. When the second electronic device is connected to a connector of the first electronic device, data may be communicated or power may be transferred between the first electronic device and the second electronic device. The data or power may be carried unilaterally (e.g., from the first electronic device to the second electronic device or from the second electronic device to the first electronic device) or bilaterally.

In the following embodiments, the term "connection sensing pin" may mean a pin capable of sensing whether an external electronic device to be connected through a connector makes a connection or in what pattern the connection is made. The connection sensing pin may be a dedicated pin only for the purpose of sensing a connection to the external electronic device or at least one pin provided for other functions and if possible to sense a connection from the external electronic device.

The terms as used herein are provided merely to describe some embodiments thereof, but not to limit the scope of other embodiments of the present disclosure. It is to be understood that the singular forms "a," "an," and "the" include plural references unless the context clearly dictates otherwise. All terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a PDA (personal digital assistant), a portable multimedia player (PMP), an MP3 player, a mobile medical device, a camera, or a wearable device (e.g., smart glasses, a head-mounted device (HMD), electronic clothes, an electronic bracelet, an electronic necklace, an electronic appcessory, an electronic tattoo, a smart mirror, or a smart watch).

According to an embodiment of the present disclosure, the electronic device may be a smart home appliance. For example, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, examples of the electronic device may include at least one of various medical devices (e.g., diverse portable medical measuring devices (a bloodsugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global positioning system (GPS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, automatic teller's machines (ATMs), point of sales (POS) devices, or Internet of Things devices (e.g., a bulb, various sensors, an electric or gas meter, a sprinkler, a fire alarm, a thermostat, a street light, a toaster, fitness equipment, a hot water tank, a heater, or a boiler).

According to various embodiments of the disclosure, examples of the electronic device may at least one of part of furniture or building/structure, an electronic board, an electronic signature receiving device, a projector, or various measurement devices (e.g., devices for measuring water, electricity, gas, or electromagnetic waves). According to an embodiment of the present disclosure, the electronic device may be one or a combination of the above-listed devices. According to an embodiment of the present disclosure, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments of the present disclosure. As used herein, the term "user" may denote a human or another device (e.g., an artificial intelligent electronic device) using the electronic device.

Referring to FIG. 1, according to an embodiment of the present disclosure, an electronic device 101 is included in a network environment 100. The electronic device 101 may include at least one of a bus 110, a processor 120, a memory 130, an input/output interface 150, a display 160, a communication interface 170, or a voltage sensor 180. In some embodiments, the electronic device 101 may exclude at least one of the components or may add another component.

The bus 110 may include a circuit for connecting the components 120, 130, 150, 160, 170, and 180 with one another and transferring communications (e.g., control messages and/or data) between the components.

The processor (or processing module) 120 may include one or more of a central processing unit (CPU), an application processor (AP), or a communication processor (CP). The processor 120 may perform control on at least one of the other components of the electronic device 101, and/or perform an operation or data processing relating to communication.

The memory 130 may include a volatile and/or non-volatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS).

For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. A plurality of applications 147 may be provided. The middleware 143 may control work requests received from the applications 147, e.g., by allocation the priority of using the system resources of the electronic device 101 (e.g., the bus 110, the processor 120, or the memory 130) to at least one of the plurality of applications 134.

The API 145 is an interface allowing the application 147 to control functions provided from the kernel 141 or the middleware 143. For example, the API 133 may include at least one interface or function (e.g., a command) for filing control, window control, image processing or text control.

The input/output interface 150 may serve as an interface that may, e.g., transfer commands or data input from a user or other external devices to other component(s) of the electronic device 101. Further, the input/output interface 150 may output commands or data received from other component(s) of the electronic device 101 to the user or the other external device.

According to an embodiment of the present disclosure, the input/output interface 150 may include at least one connector. The electronic device 101 may be connected with another external electronic device 102 via the connector to communicate data or transfer power.

The voltage sensor 180 may determine whether the connector is abnormal by comparing a preset value with a value (e.g., a voltage) measured at a connection sensing pin (e.g., identification (ID) pin or configuration channel (CC) pin) included in the connector of the input/output interface 150, according to an embodiment of the present disclosure. The connector may include at least one pin complying with various supportable communication standards (such as, but not limited to, universal serial bus (USB), micro USB (μUSB), or USB 3.1). Among the at least one pin, the connection sensing pin may be one to sense the type of an electronic device connected thereto or whether at least one external electronic device supposed to be connected via the connector makes a connection. As the connection sensing pin, various pins may be put to use depending on various types or supportable protocols of the connector. For example, a USB connector may adopt an ID pin as the connection sensing pin as set forth infra, and a USB type-C connector may employ at least one of a configuration channel one (CC1) pin, configuration channel two (CC2) pin, or a ground pin as the connection sensing pin.

This is described below in greater detail with reference to FIG. 2 or subsequent figures. Although in FIG. 1 the voltage sensor 180 is illustrated to connect with the input/output interface 150 via the bus 110, the voltage sensor 180 may be directly connected with the input/output interface 150.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user.

For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device.

The wireless communication may use at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM), as a cellular communication protocol. The wired connection may include at least one of universal serial bus (USB), high definition multimedia interface (HDMI), Recommended Standard 232 (RS-232), or plain old telephone service (POTS). The network 162 may include at least one of telecommunication networks, e.g., a computer network (e.g., LAN or WAN), Internet, or a telephone network.

The first and second external electronic devices 102 and 104 each may be a device of the same or a different type from the electronic device 101. According to an embodiment of the present disclosure, the server 106 may include a group of one or more servers. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Although FIG. 1 shows that the electronic device 101 includes the communication interface 170 to communicate with the external electronic device 102 and 104 or server 106 via the network 162, the electronic device 101 may be independently operated without a separate communication function, according to an embodiment of the present disclosure.

The server 106 may support to drive the electronic device 101 by performing at least one of operations (or functions) implemented on the electronic device 101. For example, the server 106 may include a determining server module (not shown) that may support the voltage sensor 180 implemented in the electronic device 101. For example, the determining server module may include at least one of the components of the voltage sensor 180 and perform (or instead perform) at least one of the operations (or functions) conducted by the voltage sensor 180.

The voltage sensor 180 may process at least part of information obtained from other elements (e.g., the processor 120, the memory 130, the input/output interface 150, or the communication interface 170) and may provide the same to the user in various manners. Additional information on the voltage sensor 180 may be provided through FIG. 2 described below.

Although in FIG. 1 the voltage sensor 180 is shown to be a module separate from the processor 120, at least a portion of the voltage sensor 180 may be included or implemented in the processor 120 or at least one other module, or the overall function of the voltage sensor 180 may be included or implemented in the processor 120 shown or another processor.

Figure 2:
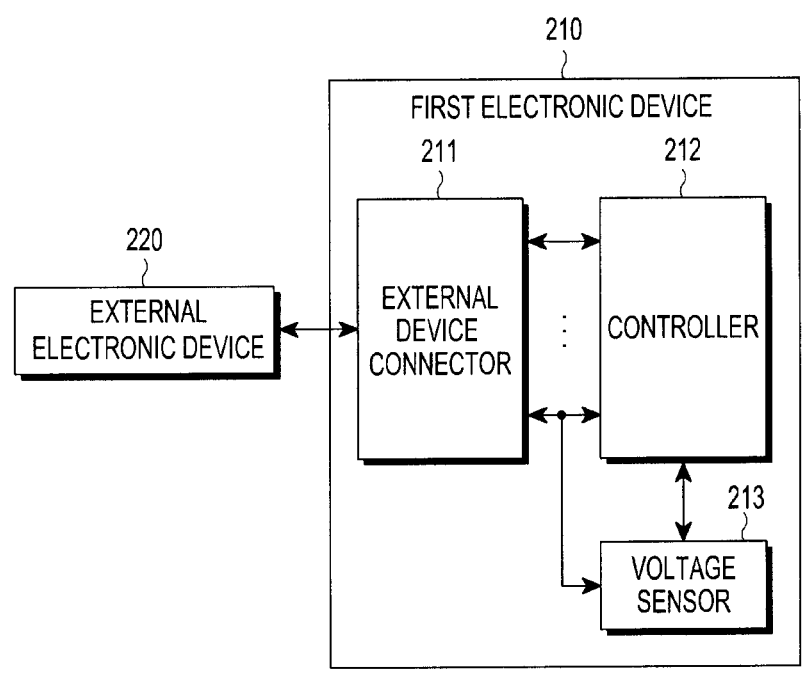
FIG. 2 is a block diagram illustrating an exemplary configuration of an electronic device according to an embodiment of the present disclosure.

FIG. 2 is a block diagram illustrating an electronic device (e.g., the electronic device 101 including the voltage sensor 180 of FIG. 1) according to an embodiment of the present disclosure. At least one component of the voltage sensor 213 of FIG. 2 may be included in the voltage sensor 180 or processor 120 of FIG. 1.

Referring to FIG. 2, the first electronic device 210 may include at least one of an external device connector 211, a controller 212, or a voltage sensor 213.

The first electronic device 210 may be electrically connected with the second electronic device, now referred to as an external electronic device 220, via the external device connector 211. According to an embodiment of the present disclosure, the "external electronic device" can be positioned outside the electronic device 210.

The external device connector 211 may have at least one connecting pin. As a contact of the connector in the external electronic device 220 comes in contact with each pin of the external device connector 211, the first electronic device 210 and the external electronic device 220 may be electrically connected with each other.

When the first electronic device 210 is electrically connected with the external electronic device 220 via the external device connector 211, the first electronic device 210 may transmit data or power to the external electronic device 220 or may receive data or power from the external electronic device 220. At least a portion of the external device connector 211 may be included in the input/output interface 150 of FIG. 1.

The controller 212 may perform control so that the first electronic device 210 may communicate with the external electronic device 220 via the external device connector 211 and may process data received from the external electronic device 220. At least some functions of the controller 212 may be included in the processor 120 of FIG. 1.

The voltage sensor 213 may be connected with at least one of the pins of the external device connector 211. According to an embodiment of the present disclosure, the voltage sensor 213 may be connected with a connection sensing pin (e.g., an identification (ID) pin, Configuration Channel 1 (CC1) pin, Configuration Channel 2 (CC2) pin, or a Ground (GND) pin) for sensing whether the external electronic device 220 is connected or the type of the external electronic device 220 among the plurality of pins of the external device connector 211. The voltage sensor 213 may comprise at least one analog to digital converter (ADC) to convert an analog voltage value sensed from the connection sensing pin to a digital voltage value.

According to an embodiment of the present disclosure, the controller 212 may determine whether a defect exists in the external device connector 211 by receiving a voltage at the ID pin of the external device connector 211 from the voltage sensor 213 and comparing the received voltage with a preset voltage. According to an embodiment of the present disclosure, the controller 212 may determine whether a defect exists in the external device connector 211 by receiving a voltage at the ID pin and at least one other pin from the voltage sensor 213 and comparing the received voltage with a preset voltage. Various embodiments for determining a defect are described below in connection with FIG. 3 or subsequent figures.

The controller 212 may perform various operations according to the result of determination. For example, when the result of determination shows that a defect exists in the external device connector 211, the controller 212 may perform control to stop current supply to at least one pin of the external device connector 211 or to display a warning message to the user through the display unit. According to an embodiment of the present disclosure, the controller 212 may cut off current supply to at least one circuit provided in the first electronic device 210 or to power off the first electronic device 210.

Meanwhile, according to an embodiment of the present disclosure, as used herein, the term "unit" or "module" may denote hardware and a functional or structural combination of software for driving the hardware to implement the technical spirit according to an embodiment of the present disclosure. For example, it should be appreciated by one of ordinary skill in that art that each functional unit or module may be a logical unit of a predetermined code and a hardware resource for executing the code, and the functional unit does not necessarily mean a physically connected code or a type of hardware.

Figure 3:
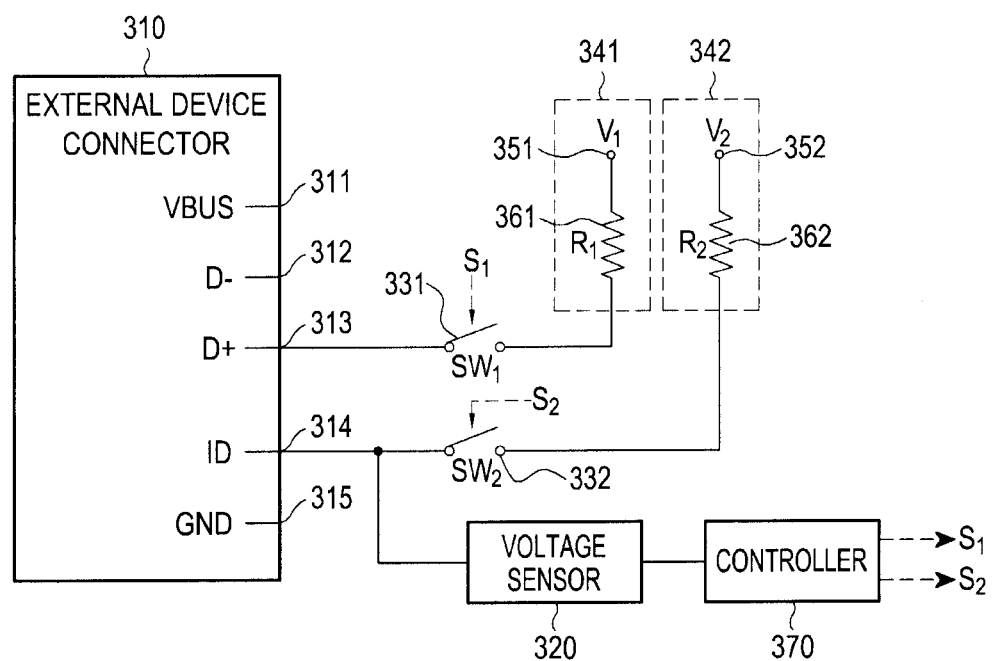
FIG. 3 is a view illustrating an exemplary circuit configuration according to an embodiment of the present disclosure.

FIG. 3 is a view illustrating an exemplary circuit configuration according to an embodiment of the present disclosure. Although in FIG. 3 a 5-pin USB connector is shown as the external device connector 310, embodiments of the present disclosure are not limited thereto. For example, for the USB type-C connector, a CC1 pin, CC2 pin, or a GND pin may be used as the connection sensing pin. Referring to FIG. 3, according to an embodiment of the present disclosure, the external device connector 310 may have at least one pin. For example, the external device connector 310 may include at least one of a bus voltage (VBUS) pin 311, a negative data (D−) pin 312, a positive data (D+) pin 313, an ID pin 314, or a GND pin 315. According to an embodiment of the present disclosure, at least one of the pins of the external device connector 310 may be excluded or at least one other pin may be added.

Each pin 311-315 of the external device connector 310 may be a pin supportive of communication complying with at least one communication standard. For instance, the communication standard may include, but is not limited to, universal serial bus (USB), micro USB, or USB type-C.

For example, the electronic device may supply power to an external electronic device connected through the VBUS pin 311. The electronic device may transmit and/or receive data to/from the external electronic device through the D− pin 312 or the D+ pin 313.

The electronic device may identify, through the ID pin 314, the type of the connected external electronic device or whether the external electronic device is connected.

For example, when the external electronic device is connected through the external device connector 310 and the ID pin 314 is floated, the external electronic device may operate in a client mode. When the ID pin 314 is shorted, the external electronic device may operate in a host mode or on-the-go (OTG) mode.

For example, according to an embodiment of the present disclosure, the function of each pin may be set as shown in Table 1. However, embodiments of the present disclosure are not limited thereto.

TABLE 1

| Contact Number | Signal Name | Typical Wiring Assignment |
| --- | --- | --- |
| 1 | VBUS | Red |
| 2 | D− | White |
| 3 | D− | Green |
| 4 | ID | <Ra_PLUG_ID |
| 5 | GND | Black |
| Shell | Shield | Drain Wire |

Referring to FIG. 3, according to an embodiment of the present disclosure, a first switch (SW$_1$) 331 and a first pull-up circuit 341 may be connected to the D+ pin 313. The first pull-up circuit 341 may include a first power source (V$_1$) 351 and a first resistor (R$_1$) 361. According to an embodiment of the present disclosure, a second switch (SW$_2$) 332 and a second pull-up circuit 342 may be connected to the ID pin 314. The second pull-up circuit 342 may include a second power source (V$_2$) 352 and a second resistor (R$_2$) 362.

A voltage sensor 320 may be connected between the ID pin 314 and the second switch 332, according to an embodiment of the present disclosure. The voltage sensor 320 may comprise at least one analog to digital converter (ADC). A controller 370 may receive a digital voltage value from the voltage sensor 320. The controller 370 may generate a control signal to control the turn-on/off of the first switch 331 and/or the second switch 332. The first switch 331 and/or the second switch 332 may comprise any element that may switch on/off a signal. When the first switch 331 turns on, the first pull-up circuit 341 may connect to the D+ pin 313, and when the second switch 332 turns on, the second pull-up circuit 342 may connect to the ID pin 314.

According to an embodiment of the present disclosure, when the first switch 331 is in an OFF state, and the second switch 332 is in an ON state, the controller 370 may detect whether the external electronic device is in connection with the external device connector 310 by measuring a voltage at the ID pin 314. For example, the second pull-up circuit 342 may be connected to the ID pin 314 by the second switch 332. When the voltage V$_{ID}$ measured at the ID pin 314 by the voltage sensor 320 is not more than a first threshold V$_{t1}$, it may be determined that the external electronic device is in connection or a defect exists (e.g., water or moisture permeation or dust clog-up).

According to an embodiment of the present disclosure, when the first switch 331 is in an ON state, and the second switch 332 is in an OFF state, the controller 370 may detect whether the external electronic device is in normal connection with the external device connector 310 or includes a defect by receiving a voltage at the ID pin 314 from the voltage sensor 320. For example, the first pull-up circuit 341 may be connected to the D+ pin 313 by the first switch 331. When the voltage V$_{ID}$ measured at the ID pin 314 by the voltage sensor 320 is not less than a second threshold V$_{t2}$, it may be determined that a defect exists (e.g., water or moisture permutation or dust clog up).

The switch-on/off and the determination as to whether a defect exists may be set to be carried out at preset times or periodically. It may also be set to be automatically performed when the electronic device fulfills a particular operation. For example, according to an embodiment of the present disclosure, it may be set to be done when the electronic device powers on. According to an embodiment of the present disclosure, the first switch 331 or the second switch 332 may be set to turn on upon determination of a defect's existence while keeping OFF otherwise.

According to an embodiment of the present disclosure, when the controller 370 determines that the external device connector 310 experiences a defect, the controller 370 may periodically and repeatedly make such determination to identify whether the defect lasts steadily. When the defect's existence is determined to last for a predetermined time or longer, the controller 370 may cause the electronic device to perform preset operations (e.g., warning the user through the screen or automatically powering off the electronic device).

Although it is described above in connection with FIG. 3 that the ID pin is used as a pin to determine the connection or type of the external electronic device by the external device connector 310, other types of pins may also be used to determine the connection or type of the external electronic device, according to an embodiment of the present disclosure. For example, when the external device connector 310 is of USB type-C, a CC1 pin, CC2 pin, or a GND pin, instead of the ID pin of FIG. 3, may be used as the connection sensing pin.

According to an embodiment of the present disclosure, an electronic device may comprise an external device connector having at least one connection sensing pin to sense connection to at least one external device connector a voltage sensor measuring a voltage at the at least one connection sensing pin and a controller determining that a defect occurs when the voltage measured by the voltage sensor meets a preset condition.

According to an embodiment of the present disclosure, the electronic device may further comprise a first pull-up resistor 361 connected to a pin (for example, the D+ pin) for data communication of the external device connector and a first switch disposed between the pin for data communication and the first pull-up resistance.

According to an embodiment of the present disclosure, the electronic device may further comprise a second pull-up resistor 362 connected to the connection sensing pin of the external device connector and a second switch 332 disposed between the connection sensing pin and the second pull-up resistor 362.

According to an embodiment of the present disclosure, the connection sensing pin may be at least one of an identification (ID) pin, a configuration channel one (CC1) pin, a CC2 pin, or a ground pin.

According to an embodiment of the present disclosure, the controller 370 may compare a first threshold with the voltage measured at the at least one connection sensing pin when the first switch is in an OFF state, and the second switch is in an ON state, and when the measured voltage is not more than the first threshold, the controller 370 may determine that the external electronic device is connected with the external device connector 310.

According to an embodiment of the present disclosure, the controller 370 may compare a second threshold with the voltage measured at the at least one connection sensing pin when the first switch is in an ON state, and the second switch is in an OFF state, and when the measured voltage is not less than the second threshold, the voltage sensor may determine that a defect exists in the external device connector.

According to an embodiment of the present disclosure, the controller may generate a control signal to control the turn-on/off of the first switch or the second switch.

According to an embodiment of the present disclosure, the controller may control to perform a preset operation corresponding to a defect occurrence.

According to an embodiment of the present disclosure, the controller may power off the electronic device corresponding to the defect existence.

According to an embodiment of the present disclosure, the electronic device may further comprise a display displaying on a screen whether a defect exists corresponding to the defect existence under control of the controller.

According to an embodiment of the present disclosure, the controller may repeatedly perform the determination at a preset period when determining that a defect exists in the external device connector.

Now described is a method for determining a defect in the electronic device described above in connection with FIGS. 4 and 5.

Figure 4:
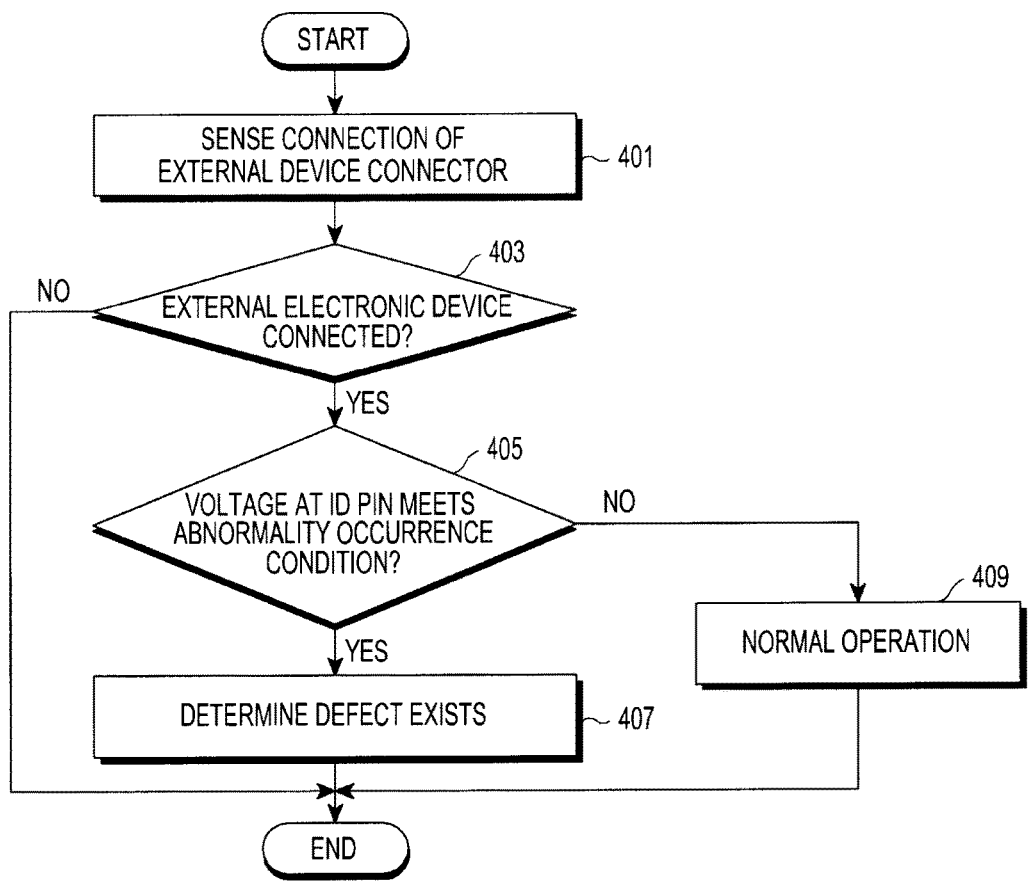
FIG. 4 is a flowchart illustrating a process for determining whether a defect exists in an electronic device according to an embodiment of the present disclosure.

FIG. 4 is a flowchart illustrating a process for determining the existence of a defect in an electronic device according to an embodiment of the present disclosure. Although the ID pin is used as a pin to determine the connection or type of the external electronic device by the external device connector 310 is described above in connection with FIG. 4, other types of pins may also be used to determine the connection or type of the external electronic device, according to an embodiment of the present disclosure. For example, when the external device connector 310 is of USB type-C, a CC1 pin, CC2 pin, or a GND pin, instead of the ID pin of FIG. 3, may be used as the connection sensing pin.

Referring to FIG. 4, the electronic device may sense a connection with an external electronic device through various methods in operation 401. For example, when the first switch 331 is in an OFF state, and the second switch 332 is in an ON state, the voltage sensor 320 may detect whether the external electronic device is in connection with the external device connector 310 by measuring a voltage at the ID pin 314.

When the electronic device is determined to connect with the external electronic device in operation 403, a voltage at a connection sensing pin (e.g., the ID pin) may be measured to determine whether the voltage at the connection sensing pin (e.g., the ID pin) meets a defect condition (e.g., when the voltage $V_{ID}$ measured at the ID pin 314 is not more than the second threshold $V_{t2}$) according to an embodiment of the present disclosure (operation 405).

When the defect condition is determined to be met, a defect is determined to exist, and preset operations corresponding to the defect may be carried out (operation 407). When the defect is not determined to be met, the electronic device may perform normal operations (operation 409).

Figure 5:
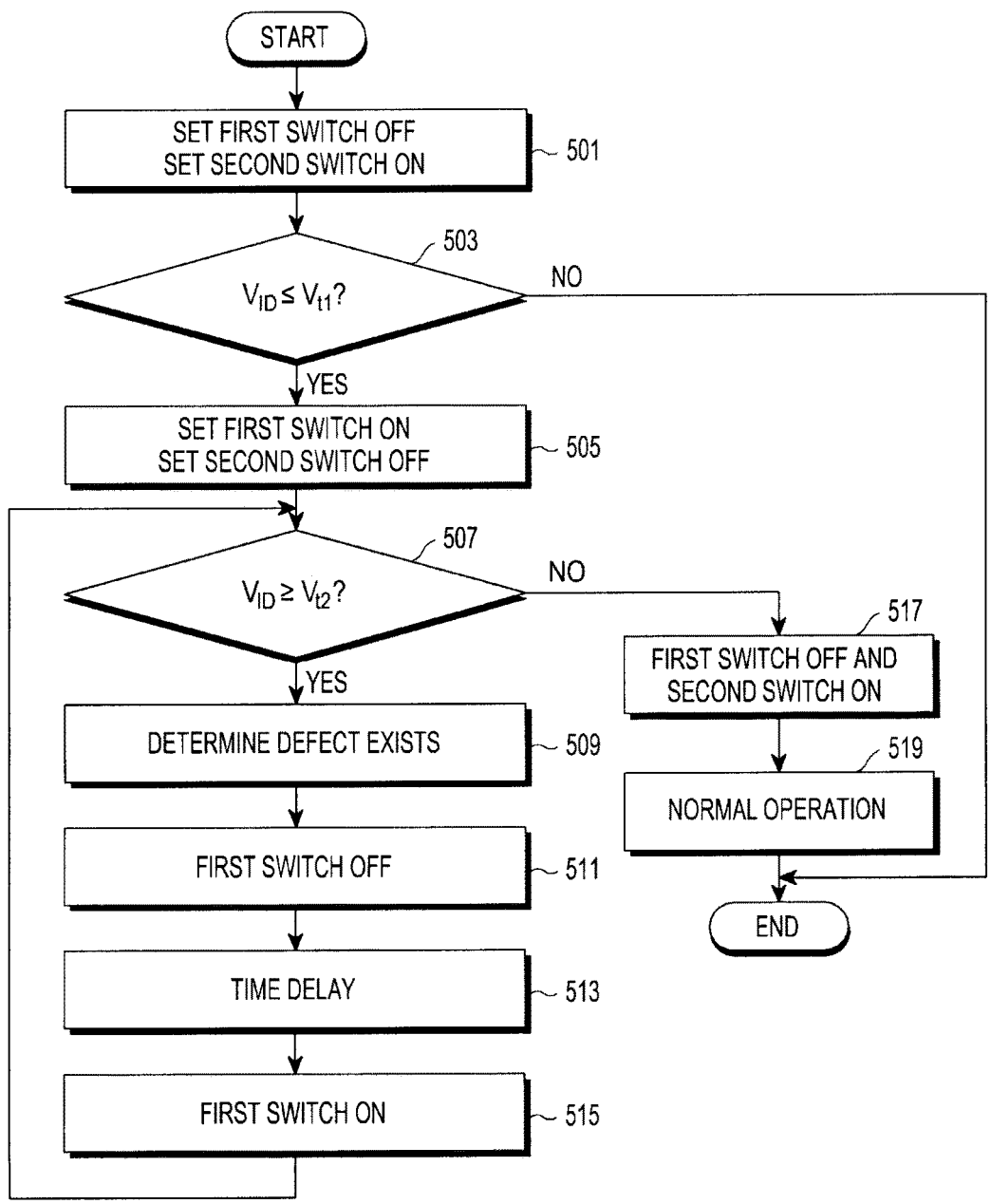
FIG. 5 is a flowchart illustrating a process for determining whether a defect exists in an electronic device according to an embodiment of the present disclosure.

FIG. 5 is a flowchart illustrating a process for determining a defect in an electronic device according to an embodiment of the present disclosure. Referring to FIG. 5, when the first switch 331 is set to an OFF state, and the second switch 332 is set to an ON state in operation 501, a voltage at the connection sensing pin (e.g., the ID pin 314) may be measured to detect whether the external electronic device is in connection with the external device connector 310. For example, the second pull-up circuit 342 may be connected to the connection sensing pin (e.g., the ID pin 314) by the switch-on/off as in operation 501. When the voltage $V_{ID}$ measured at the connection sensing pin (e.g., the ID pin 314) is not more than the first threshold $V_{t1}$ in operation 503, it may be determined that the external electronic device is in connection or a defect has occurred (e.g., water or moisture permeation or dust clog up).

When the first switch 331 is set to an ON state, and the second switch 332 is set to an OFF state in operation 505, a voltage at the connection sensing pin (e.g., the ID pin 314) may be measured to determine whether the external electronic device is in normal connection with the external device connector 310 or undergoes a defect. When the voltage $V_{ID}$ measured at the connection sensing pin (e.g., the ID pin 314) is not less than the second threshold $V_{t2}$ in operation 507, it may be determined in operation 509 that a defect (e.g., water or moisture permeation or dust clog up) has arisen.

According to an embodiment of the present disclosure, when a defect is determined to has occurred in operation 509, various preset operations corresponding to the defect may be performed.

According to an embodiment of the present disclosure, the first switch 331 turns off in operation 511, and a predetermined time passes by in operation 513. The first switch 331 may then turn back off in operation 515. While the first switch 331 remains ON, the determination as to whether a defect is present, such as operation 507, may be repeated. The repeated operation may be performed at preset periods or by a preset number of times.

When the voltage $V_{ID}$ measured at the connection sensing pin (e.g., the ID pin 314) is less than the second threshold $V_{t2}$ in operation 507, it is determined to be in a normal connection state, and in operation 517, the first switch 331 may be turned off while the second switch 332 may be turned on. In operation 519, the electronic device may be normally operated depending on a result of the determination.

At least one of the operations shown in FIGS. 4 and 5 may be omitted, and at least one other operation may be added between the operations. The operations shown in FIGS. 4 and 5 may be processed in the order as shown, or at least one of the operations may be processed in a different order.

According to an embodiment of the present disclosure, a method for determining a defect in an electronic device may comprise comparing a preset voltage with a voltage measured at, at least, one connection sensing pin provided in an external device connector to sense connection to at least one external device connector and determining that a defect occurs when a result of the determination meets a preset condition.

According to an embodiment of the present disclosure, the connection sensing pin may be at least one of an identification (ID) pin, a configuration channel one (CC1) pin, a CC2 pin, or a ground pin. According to an embodiment of the present disclosure, a first pull-up resistance may be connected to a pin (D+ pin) for data communication of the external device connector, and a first switch may be disposed between the pin for data communication and the first pull-up resistance.

According to an embodiment of the present disclosure, a second pull-up resistor may be connected to the connection sensing pin of the external device connector, and a second switch may be disposed between the connection sensing pin and the second pull-up resistor.

According to an embodiment of the present disclosure, the method may further comprise comparing a first threshold with the voltage measured at the at least one connection sensing pin when the first switch is in an OFF state, and the second switch is in an ON state and, when the measured voltage is not more than the first threshold, determining that the external electronic device is connected with the external device connector.

According to an embodiment of the present disclosure, the method may further comprise comparing a second threshold with the voltage measured at the at least one connection sensing pin when the first switch is in an ON state, and the second switch is in an OFF state and, when the measured voltage is not less than the second threshold, determining that a defect exists in the external device connector.

According to an embodiment of the present disclosure, the method may further comprise generating a control signal to control the turn-on/off of the first switch or the second switch.

According to an embodiment of the present disclosure, the method may further comprise, when the defect is determined to exist, performing a preset operation corresponding to the existence of the defect.

According to an embodiment of the present disclosure, the preset operation may comprise powering off the electronic device.

According to an embodiment of the present disclosure, the preset operation may comprise displaying, on the screen, whether a defect exists.

According to an embodiment of the present disclosure, the determination may be repeatedly performed at a preset period when determining that a defect occurs in the external device connector.

Figure 6:
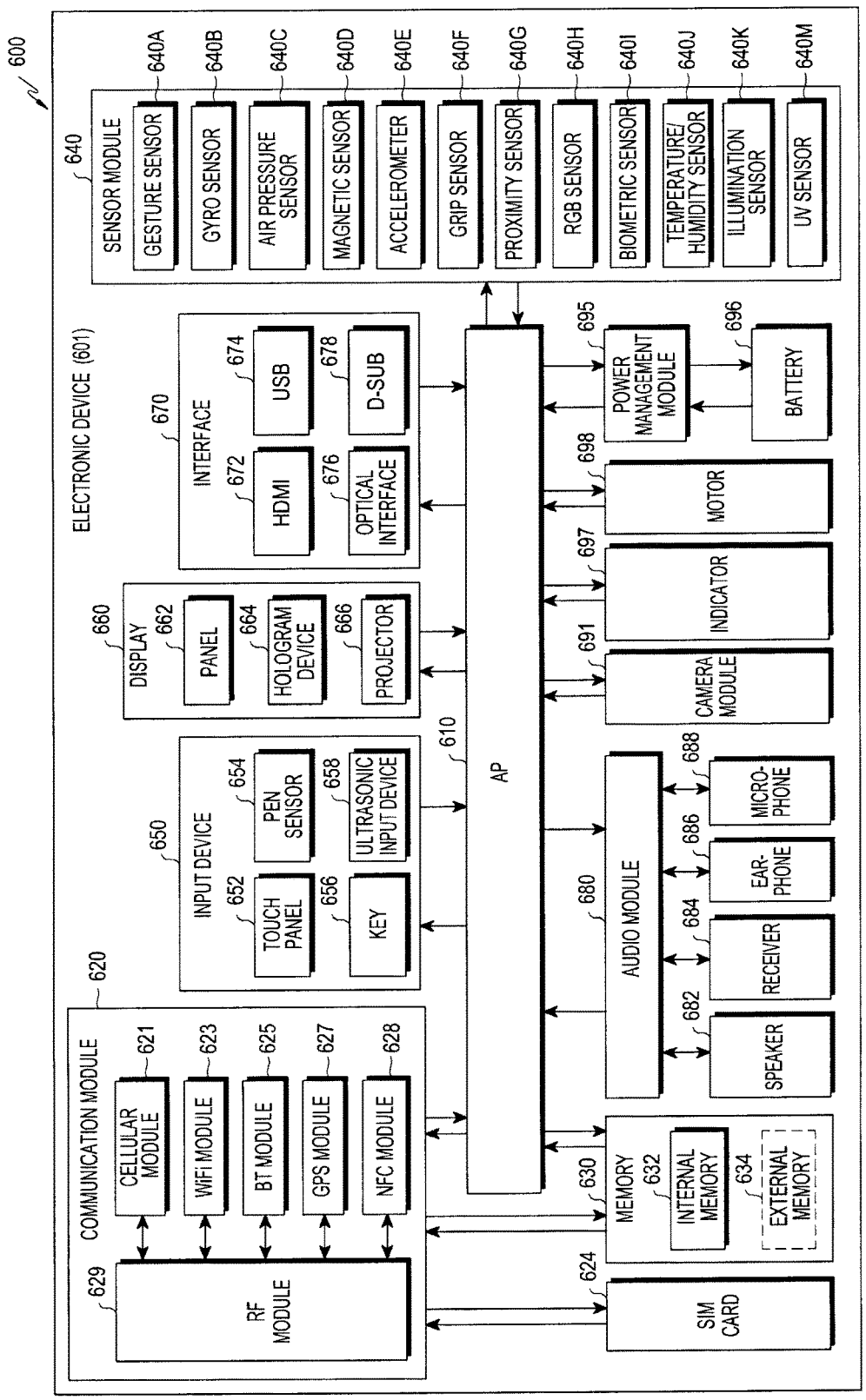
FIG. 6 is a block diagram illustrating a detailed structure of an electronic device according to an embodiment of the present disclosure.

FIG. 6 is a block diagram 600 illustrating an electronic device 601 according to an embodiment of the present disclosure. The electronic device 601 may include the whole or part of the configuration of, e.g., the electronic device 101 shown in FIG. 1. The electronic device 601 may include one or more application processors (APs) 610, a communication module 620, an SIM (subscriber identification module) card 624, a memory 630, a sensor module 640, an input device 650, a display 660, an interface 670, an audio module 680, a camera module 691, a power management module 695, a battery 696, an indicator 697, and a motor 698.

The AP 610 may control multiple hardware and software components connected to the AP 610 by running, e.g., an operating system or application programs, and the AP 610 may process and compute various data. The AP 610 may be implemented in, e.g., a system on chip (SoC). According to an embodiment of the present disclosure, the AP 610 may further include a graphic processing unit (GPU) and/or an image signal processor. The AP 610 may include at least some (e.g., the cellular module 621) of the components shown in FIG. 6. The AP 610 may load a command or data received from at least one of other components (e.g., a non-volatile memory) on a volatile memory, process the command or data, and store various data in the non-volatile memory.

The communication module 620 may have the same or similar configuration to the communication interface 170 of FIG. 1. The communication module 620 may include, e.g., a cellular module 621, a wireless fidelity (Wi-Fi) module 623, a Bluetooth (BT) module 625, a global positioning system (GPS) module 627, a near-field communication (NFC) module 628, and a radio frequency (RF) module 629.

The cellular module 621 may provide voice call, video call, text, or Internet services through a communication network (e.g., a long term evolution (LTE), LTE-advanced (LTE-A), code division multiple access (CDMA), wideband CDMA (WCDMA), universal mobile telecommunications system (UMTS), wireless broadcast (WiBro), or global system for mobile communications (GSM) network). The cellular module 621 may perform identification or authentication on the electronic device 601 in the communication network using a subscriber identification module (e.g., the SIM card 624). According to an embodiment of the present disclosure, the cellular module 621 may perform at least some of the functions providable by the AP 610. According to an embodiment of the present disclosure, the cellular module 621 may include a communication processor (CP).

The Wi-Fi module 623, the BT module 625, the GPS module 627, or the NFC module 628 may include a process for, e.g., processing data communicated through the module. At least some (e.g., two or more) of the cellular module 621, the Wi-Fi module 623, the BT module 625, the GPS module 627, and the NFC module 628 may be included in a single integrated circuit (IC) or an IC package.

The RF module 629 may communicate data, e.g., communication signals (e.g., RF signals). The RF module 629 may include, e.g., a transceiver, a power amp module (PAM), a frequency filter, an LNA (low noise amplifier), or an antenna. According to an embodiment of the present disclosure, at least one of the cellular module 621, the Wi-Fi module 623, the BT module 625, the GPS module 627, or the NFC module 628 may communicate RF signals through a separate RF module.

The SIM card 624 may include, e.g., a card including a subscriber identification module and/or an embedded SIM, and may contain unique identification information (e.g., an integrated circuit card identifier (ICCID) or subscriber information (e.g., an international mobile subscriber identity (IMSI)).

The memory 630 (e.g., the memory 630) may include, e.g., an internal memory 632 or an external memory 634. The internal memory 632 may include at least one of, e.g., a volatile memory (e.g., a dynamic RAM (DRAM), a static RAM (SRAM), a synchronous dynamic RAM (SDRAM), etc.) or a non-volatile memory (e.g., a one time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD).

The external memory 634 may include a flash drive, e.g., a CF (compact flash) memory, an SD (9secure digital) memory, a micro-SD memory, a min-SD memory, an xD (extreme digital) memory, or a Memory Stick™. The external memory 634 may be functionally and/or physically connected with the electronic device 601 via various interfaces.

For example, the sensor module 640 may measure a physical quantity or detect an operational state of the electronic device 601, and the sensor module 940 may convert the measured or detected information into an electrical signal. The sensor module 640 may include, e.g., a gesture sensor 640A, a gyro sensor 640B, an air pressure sensor 640C, a magnetic sensor 640D, an acceleration sensor 640E, a grip sensor 640F, a proximity sensor 640G, a color sensor 640H such as a red-green-blue (RGB) sensor, a bio sensor 640I, a temperature/humidity sensor 640J, an illumination sensor 640K, or an ultra violet (UV) sensor 640M. Additionally or alternatively, the sensing module 640 may include, e.g., an E-nose sensor, an electromyography (EMG) sensor, an electroencephalogram (EEG) sensor, an electrocardiogram (ECG) sensor, an infrared (IR) sensor, an iris sensor, or a finger print sensor. The sensor module 640 may further include a control circuit for controlling at least one or more of the sensors included in the sensing module. According to an embodiment of the present disclosure, the electronic device 601 may further include a processor configured to control the sensor module 640 as part of an AP 610 or separately from the AP 610, and the electronic device 901 may control the sensor module 640 while the AP is in a sleep mode.

The input unit 650 may include, e.g., a touch panel 652, a (digital) pen sensor 654, a key 656, or an ultrasonic input device 658. The touch panel 652 may use at least one of capacitive, resistive, infrared, or ultrasonic methods. The touch panel 652 may further include a control circuit. The touch panel 652 may further include a tactile layer and may provide a user with a tactile reaction.

The (digital) pen sensor 654 may include, e.g., a part of a touch panel or a separate sheet for recognition. The key 656 may include e.g., a physical button, optical key or key pad. The ultrasonic input device 658 may use an input tool that generates an ultrasonic signal and enable the electronic device 601 to identify data by sensing the ultrasonic signal to a microphone (e.g., a microphone 688).

The display 660 (e.g., the display 160) may include a panel 662, a hologram device 664, or a projector 666. The panel 662 may have the same or similar configuration to the display 160 of FIG. 1. The panel 662 may be implemented to be flexible, transparent, or wearable. The panel 662 may also be incorporated with the touch panel 652 in a module. The hologram device 664 may make three dimensional (3D) images (holograms) in the air by using light interference. The projector 666 may display an image by projecting light onto a screen. The screen may be, for example, located inside or outside of the electronic device 601. In accordance with an embodiment, the display 660 may further include a control circuit to control the panel 662, the hologram device 664, or the projector 666.

The interface 670 may include e.g., a high definition multimedia Interface (HDMI) 672, a USB 674, an optical interface 676, or a D-subminiature (D-sub) 678. The interface 670 may be included in e.g., the communication interface 170 shown in FIG. 1. Additionally or alternatively, the interface 670 may include a Mobile High-definition Link (MHL) interface, a secure digital (SD) card/multimedia card (MMC) interface, or IrDA standard interface.

The audio module 680 may convert a sound into an electric signal or vice versa, for example. At least a part of the audio module 680 may be included in e.g., the input/output interface 150 as shown in FIG. 1. The audio module 680 may process sound information input or output through e.g., a speaker 682, a receiver 684, an earphone 686, or a microphone 688.

For example, the camera module 691 may be a device for capturing still images and videos, and may include, according to an embodiment of the present disclosure, one or more image sensors (e.g., front and back sensors), a lens, an Image Signal Processor (ISP), or a flash such as an LED or xenon lamp.

The power manager module 695 may manage power of the electronic device 601, for example. Although not shown, according to an embodiment of the present disclosure, a power management integrated circuit (PMIC), a charger IC, or a battery or fuel gauge is included in the power manager module 695. The PMIC may have a wired and/or wireless recharging scheme. The wireless charging scheme may include e.g., a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 696, a voltage, a current, or a temperature while the battery 696 is being charged. The battery 696 may include, e.g., a rechargeable battery or a solar battery.

The indicator 697 may indicate a particular state of the electronic device 601 or a part of the electronic device (e.g., the AP 610), including e.g., a booting state, a message state, or recharging state. The motor 698 may convert an electric signal to a mechanical vibration and may generate a vibrational or haptic effect. Although not shown, a processing unit for supporting mobile TV, such as a GPU may be included in the electronic device 601. The processing unit for supporting mobile TV may process media data conforming to a standard for Digital Multimedia Broadcasting (DMB), Digital Video Broadcasting (DVB), or mediaFLO™.

Each of the aforementioned components of the electronic device may include one or more parts, and a name of the part may vary with a type of the electronic device. The electronic device in accordance with various embodiments of the present disclosure may include at least one of the aforementioned components, omit some of them, or include other additional component(s). Some of the components may be combined into an entity, but the entity may perform the same functions as the components may do.

Figure 7:
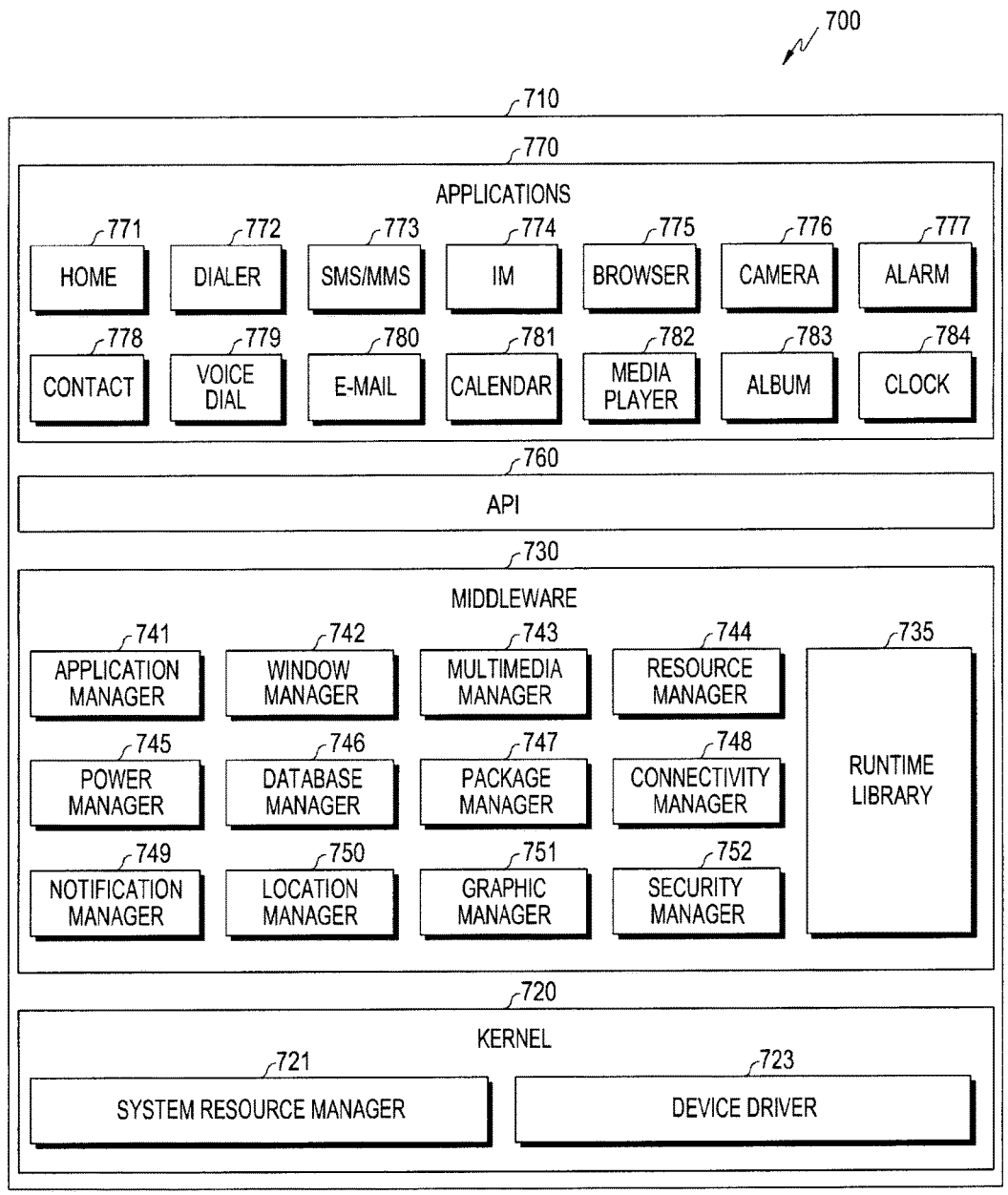
FIG. 7 is a block diagram illustrating a program module according to an embodiment of the present disclosure.

FIG. 7 is a block diagram 700 illustrating a program module 710 according to an embodiment of the present disclosure. According to an embodiment of the present disclosure, the program module 710 (e.g., the program 140) may include an operating system (OS) controlling resources related to the electronic device (e.g., the electronic device 101) and/or various applications (e.g., the application 147) driven on the operating system. The operating system may include, e.g., Android, iOS, Windows, Symbian, Tizen, or Bada.

The program module 710 may include, e.g., a kernel 720, middleware 730, an application programming interface (API) 760, and/or an application 770. At least a part of the program module 710 may be preloaded on the electronic device or may be downloaded from a server (e.g., the server 106).

The kernel 720 (e.g., the kernel 141 of FIG. 1) may include, e.g., a system resource manager 721 or a device driver 723. The system resource manager 721 may perform control, allocation, or recovery of system resources. According to an embodiment of the present disclosure, the system resource manager 721 may include a process managing unit, a memory managing unit, or a file system managing unit. The device driver 723 may include, e.g., a display driver, a camera driver, a Bluetooth driver, a shared memory driver, a USB driver, a keypad driver, a Wi-Fi driver, an audio driver, or an inter-process communication (IPC) driver.

The middleware 730 may provide various functions to the application 770 through the API 760 so that the application 770 may efficiently use limited system resources in the electronic device or provide functions jointly required by applications 770. According to an embodiment of the present disclosure, the middleware 730 (e.g., middleware 143) may include at least one of a runtime library 735, an application manager 741, a window manager 742, a multimedia manager 743, a resource manager 744, a power manager 745, a database manager 746, a package manager 747, a connectivity manager 748, a notification manager 749, a location manager 750, a graphic manager 751, or a security manager 752.

The runtime library 735 may include a library module used by a compiler in order to add a new function through a programming language while, e.g., the application 770 is being executed. The runtime library 735 may perform input/output management, memory management, or operation on arithmetic functions.

The application manager 741 may manage the life cycle of at least one application of, e.g., the applications 770. The window manager 742 may manage GUI resources used on the screen. The multimedia manager 743 may grasp formats necessary to play various media files and use a codec appropriate for a format to perform encoding or decoding on media files. The resource manager 744 may manage resources, such as source code of at least one of the applications 770, memory or storage space.

The power manager 745 may operate together with, e.g., a basic input/output system (BIOS) to manage battery or power and provide power information necessary for operating the electronic device. The database manager 746 may generate, search, or vary a database to be used in at least one of the applications 770. The package manager 747 may manage installation or update of an application that is distributed in the form of a package file.

The connectivity manager 748 may manage wireless connectivity, such as, e.g., Wi-Fi or Bluetooth. The notification manager 749 may display or notify an event, such as a coming message, appointment, or proximity notification, of the user without interfering with the user. The location manager 750 may manage locational information on the electronic device. The graphic manager 751 may manage graphic effects to be offered to the user and their related user interface. The security manager 752 may provide various security functions necessary for system security or user authentication. According to an embodiment of the present disclosure, when the electronic device (e.g., the electronic device 101) has telephony capability, the middleware 730 may further include a telephony manager for managing voice call or video call functions of the electronic device.

The middleware 730 may include a middleware module forming a combination of various functions of the above-described components. The middleware 730 may provide a specified module per type of the operating system in order to provide a differentiated function. Further, the middleware 730 may dynamically omit some existing components or add new components.

The API 760 (e.g., the API 145) may be a set of, e.g., API programming functions and may have different configurations depending on operating systems. For example, in the case of Android or iOS, one API set may be provided per platform, and in the case of Tizen, two or more API sets may be offered per platform.

The application 770 (e.g., the application 147) may include one or more applications that may provide functions such as, e.g., a home 771, a dialer 772, a short message service (SMS)/multimedia messaging service (MMS) 773, an instant message (IM) 774, a browser 775, a camera 776, an alarm 777, a contact 778, a voice dial 779, an email 780, a calendar 781, a media player 782, an album 783, or a clock 784, a health-care (e.g., measuring the degree of workout or blood sugar), or provision of environmental information (e.g., provision of air pressure, moisture, or temperature information).

According to an embodiment of the present disclosure, the application 770 may include an application (hereinafter, "information exchanging application" for convenience) supporting information exchange between the electronic device (e.g., the electronic device 101) and an external electronic device (e.g., the electronic devices 102 and 104). Examples of the information exchange application may include, but is not limited to, a notification relay application for transferring specific information to the external electronic device, or a device management application for managing the external electronic device.

For example, the notification relay application may include a function for relaying notification information generated from other applications of the electronic device (e.g., the SMS/MMS application, email application, health-care application, or environmental information application) to the external electronic device (e.g., the electronic devices 102 and 104). Further, the notification relay application may receive notification information from, e.g., the external electronic device and may provide the received notification information to the user. The device management application may perform at least some functions of the external electronic device (e.g., the electronic device 102 or 104) communicating with the electronic device (for example, turning on/off the external electronic device (or some components of the external electronic device) or control of brightness (or resolution) of the display), and the device management application may manage (e.g., install, delete, or update) an application operating in the external electronic device or a service (e.g., call service or message service) provided from the external electronic device.

According to an embodiment of the present disclosure, the application 770 may include an application (e.g., a health-care application) designated depending on the attribute (e.g., as an attribute of the electronic device, the type of electronic device is a mobile medical device) of the external electronic device (e.g., the electronic devices 102 and 104). According to an embodiment of the present disclosure, the application 770 may include an application received from the external electronic device (e.g., the server 106 or electronic devices 102 and 104). According to an embodiment of the present disclosure, the application 770 may include a preloaded application or a third party application downloadable from a server. The names of the components of the program module 710 according to the shown embodiment may be varied depending on the type of operating system.

According to an embodiment of the present disclosure, at least a part of the program module 710 may be implemented in software, firmware, hardware, or in a combination of two or more thereof. At least a part of the programming module 710 may be implemented (e.g., executed) by e.g., a processor (e.g., the AP 610). At least a part of the program module 710 may include e.g., a module, program, routine, set of instructions, process, or the like for performing one or more functions.

The term 'module' or 'functional unit' may refer to a unit including one of hardware, software, and firmware, or a combination thereof. The term 'module' or 'functional unit' may be interchangeably used with a unit, logic, logical block, component, or circuit. The term 'module' or 'functional unit' may be a minimum unit or part of an integrated component. The 'module' may be a minimum unit or part of performing one or more functions. The 'module' or 'functional unit' may be implemented mechanically or electronically. For example, the 'module' or 'functional unit' may include at least one of Application Specific Integrated Circuit (ASIC) chips, Field Programmable Gate Arrays (FPGAs), or Programmable Logic Arrays (PLAs) that perform some operations, which have already been known or will be developed in the future.

According to an embodiment of the present disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

The computer-readable storage medium may include a hardware device, such as hard discs, floppy discs, and magnetic tapes (e.g., a magnetic tape), optical media such as compact disc read only memories (ROMs) (CD-ROMs) and digital versatile discs (DVDs), magneto-optical media such as floptical disks, ROMs, random access memories (RAMs), flash memories, and/or the like. Examples of the program instructions may include not only machine language codes but also high-level language codes which are executable by various computing means using an interpreter. Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, simultaneously, repeatedly, or heuristically. Furthermore, some of the operations may be performed in a different order, or omitted, or include other additional operation(s).

According to an embodiment of the present disclosure, there is provided a non-transitory storage medium storing commands, the commands configured to be executed by at least one processor to enable the at least one processor to perform at least one operation, wherein the at least one operation may comprise comparing a preset voltage with a voltage measured at, at least, one connection sensing pin provided in an external device connector to sense connection to at least one external device connector and determining that a defect exists when a result of the determination meets a preset condition.

As is apparent from the foregoing description, according to embodiments of the present disclosure, an electronic device and method for determining a defect in an electronic device may determine whether a connector connected with an external electronic device is wet, moist, or dusty by detecting a voltage at a connection sensing pin (e.g., an ID pin, or configuration channel (CC) pin) of the connector.

The embodiments herein are provided merely for better understanding of the present disclosure, and the present disclosure should not be limited thereto or thereby. It should be appreciated by one of ordinary skill in the art that various changes in form or detail may be made to the embodiments without departing from the scope of the present disclosure defined by the following claims or equivalents thereof.

What is claimed is:

1. An electronic device, comprising:
    an external device connector having at least one connection sensing pin to sense connection to at least one external electronic device;
    a voltage sensor measuring a voltage at the at least one connection sensing pin; and
    a controller determining that a defect occurs when the voltage measured by the voltage sensor meets a preset condition,
    wherein the controller repeatedly performs the determination at a preset period when determining that the defect exists in the external device connector, and controls to perform a preset operation when the defect is determined to last for a predetermined time or longer.

2. The electronic device of claim 1, wherein the connection sensing pin is at least one of an identification (ID) pin, a configuration channel one (CC1) pin, a configuration channel two (CC2) pin, or a ground pin.

3. The electronic device of claim 1, further comprising:
    a first pull-up resistor connected to a D+ pin configured to communicate data from the external device connector; and
    a first switch disposed between the D+ pin configured to communicate data and the first pull-up resistor.

4. The electronic device of claim 3, further comprising:
    a second pull-up resistor connected to the at least one connection sensing pin of the external device connector; and
    a second switch disposed between the at least one connection sensing pin and the second pull-up resistor.

5. The electronic device of claim 4, wherein the controller compares a first threshold with the voltage measured at the at least one connection sensing pin when the first switch is in an OFF state, and the second switch is in an ON state, and when the measured voltage is not more than the first threshold, the controller determines that the external electronic device is connected with the external electronic device.

6. The electronic device of claim 5, wherein the controller compares a second threshold with the voltage measured at the at least one connection sensing pin when the first switch is in the ON state, and the second switch is in the OFF state, and when the measured voltage is not less than the second threshold, the controller determines that a defect exists in the external device connector.

7. The electronic device of claim 4, wherein the controller generates a control signal to turn on or off of the first switch or the second switch.

8. The electronic device of claim 1, wherein the controller controls to perform a preset operation corresponding to a defect occurrence.

9. The electronic device of claim 8, wherein the controller powers off the external electronic device corresponding to the defect occurrence.

10. The electronic device of claim 8, further comprising a display displaying on a screen whether a defect exists corresponding to the defect existence under control of the controller.

11. A method for determining a defect in an electronic device, the method comprising:
- comparing a preset voltage with a voltage measured at, at least one connection sensing pin provided in an external device connector to sense connection to at least one external electronic device;
- determining that a defect exists when a result of a determination meets a preset condition, wherein the determination is repeatedly performed at a preset period when a defect is determined to exist in the external device connector; and
- performing a preset operation when the defect is determined to last for a predetermined time or longer.

12. The method of claim 11, wherein the connection sensing pin is at least one of an identification (ID) pin, a configuration channel one (CC1) pin, a configuration channel two (CC2) pin, or a ground pin.

13. The method of claim 11, wherein a first pull-up resistor is connected to a D+ pin configured to communicate data from the external device connector, and wherein a first switch is disposed between the D+ pin configured to communicate data and the first pull-up resistor.

14. The method of claim 13, wherein a second pull-up resistor is connected to the at least one connection sensing pin of the external device connector, and wherein a second switch is disposed between the at least one connection sensing pin and the second pull-up resistor.

15. The method of claim 14, further comprising:
- comparing a first threshold with the voltage measured at the at least one connection sensing pin when the first switch is in an OFF state, and the second switch is in an ON state; and
- when the measured voltage is not more than the first threshold, determining that the external electronic device is connected with the external device connector.

16. The method of claim 15, further comprising:
- comparing a second threshold with the voltage measured at the at least one connection sensing pin when the first switch is in an ON state, and the second switch is in an OFF state; and
- when the measured voltage is not less than the second threshold, determining that a defect exists in the external device connector.

17. The method of claim 14, further comprising generating a control signal to turn on or off of the first switch or the second switch.

18. The method of claim 12, further comprising, when the defect is determined to exist, performing a preset operation corresponding to an occurrence of the defect.

19. The method of claim 18, wherein the preset operation includes powering off the external electronic device.

20. The method of claim 18, wherein the preset operation includes displaying on a screen a defect that the defect exists.

* * * * *